United States Patent [19]

Kawagoe et al.

[11] Patent Number: 5,475,268
[45] Date of Patent: Dec. 12, 1995

[54] SEMICONDUCTOR DEVICE HAVING AN ALIGNMENT MARK

[75] Inventors: Tomoya Kawagoe; Akihisa Oishi; Mitsutaka Niiro; Katsumi Dosaka, all of Hyogo, Japan

[73] Assignee: Mitsubishi Denki Kabushiki Kaisha, Tokyo, Japan

[21] Appl. No.: 357,282

[22] Filed: Dec. 13, 1994

[30] Foreign Application Priority Data

Jun. 13, 1994 [JP] Japan .................................. 6-130042

[51] Int. Cl.$^6$ .......................... H01L 23/48; H01L 23/522
[52] U.S. Cl. ............................. 257/797; 257/98; 257/774; 257/758; 257/776
[58] Field of Search ............................. 257/98, 620, 758, 257/760, 774, 797

[56] References Cited

U.S. PATENT DOCUMENTS 5,027,176  6/1991  Saika et al. .............................. 257/758
5,034,799  7/1991  Tomita et al. ........................... 257/758
5,391,921  2/1995  Kudoh et al. ............................ 257/760

FOREIGN PATENT DOCUMENTS 0005547  1/1986  Japan ..................................... 257/758

*Primary Examiner*—Robert P. Limanek
*Assistant Examiner*—Alexander Oscar Williams
*Attorney, Agent, or Firm*—Lowe, Price, LeBlanc & Becker

[57] ABSTRACT

A semiconductor device having an alignment mark which is improved to enable accurate recognition of the alignment mark is provided. A first interconnection layer is provided on a semiconductor substrate. A second interconnection layer is provided on an interlayer insulating film so that first and second interconnection layers cross each other with interlayer insulating film therebetween. A surface of second interconnection layer includes, in a region where first and second interconnection layers cross each other, a flat portion which reflects laser beam vertically and upwardly and a portion including concaves and convexes which reflects laser beam irregularly, which together form an alignment mark.

6 Claims, 10 Drawing Sheets

SEMICONDUCTOR DEVICE HAVING AN ALIGNMENT MARK

BACKGROUND OF THE INVENTION

1. Field of the Invention

The present invention relates generally to a semiconductor device, and more particularly, to a semiconductor device having an alignment mark which is detected by laser beam.

2. Description of the Background Art

FIG. 7 is a plan view of a wafer. A plurality of chips 41 are formed on wafer 40. FIG. 8 is a plan view of a chip. A semiconductor device (not shown) is formed on chip 41. A plurality of alignment marks 42, which will be described later, are usually formed on chip 41.

Functions of the alignment marks 42 will now be described.

A semiconductor device, in particular, a semiconductor memory device has a spare portion therein. If a portion of a circuit of the semiconductor memory device is found to be defective, the defective portion is separated from a main portion by cutoff of a particular portion of an interconnection, and the defective portion is replaced with the above-described spare portion. A defective portion is found by a test equipment, and coordinates of an interconnection to be cut off are calculated. Laser beam is directed to the interconnection which is located on the calculated coordinates, whereby the interconnection is cut off. A laser trimmer (an apparatus for carrying out the above-described operation) has functions of directing laser beam with an arbitrary intensity to an arbitrary portion of chip 41 and of measuring intensity of the directed laser beam reflected from a chip surface. The laser trimmer recognizes alignment mark 42 provided on each chip 41, of which coordinates are known in advance, and moves a laser source to a position where an interconnection should be cut off, based on the coordinates of this alignment mark 42. When the location is determined, laser beam is directed thereto, and the interconnection is cut out.

FIG. 9 is a plan view of a portion of a conventional semiconductor device, where an alignment mark exists. FIG. 10 is a cross section taken along line X—X shown in FIG. 9.

Referring to these figures, a first interlayer insulating film 6a is provided on a semiconductor substrate 5. A first interconnection layer 12 made of a low reflectance material (for example, polysilicon) is provided on first interlayer insulating film 6a. A second interlayer insulating film 6b is provided on first interlayer insulating film 6a so that it covers first interconnection layer 12. A second interconnection layer 11 is provided on first interlayer insulating film 6a, so that first and second interconnection layers 12 and 11 cross each other with second interlayer insulating film 6b therebetween. Second interconnection layer 11 is formed of a high reflectance material (for example, A1 interconnection). In a semiconductor device with a multi-layer interconnection structure, the second interconnection layer is the uppermost interconnection layer, and is a power supply interconnection.

Second interconnection layer 11 is provided with an L-shaped opening 11a and a rectangular opening 11b, when viewed two-dimensionally, in a region where first and second interconnection layers 12 and 11 cross each other. Thus, an alignment mark is formed. Use of such a connected portion for an alignment mark eliminates the need to form an alignment mark separately.

Operation will now be described. The laser trimmer directs a laser beam to the approximate location where the alignment mark exists, for example, from point a to point b of FIG. 9 (hereinafter represented by a–b). The intensity of reflected light at each point between a–b is measured. FIG. 12 is a graph showing intensity of reflected light at each point between a–b of FIG. 9. Referring to FIGS. 9, 11 and 12, when laser beam 43 is directed to a–c or d–b, laser beam 43 passes through second interlayer insulating film 6b, and then is reflected from first interconnection layer 12 which is made of a low reflectance material. Since second interconnection layer 12 is made of a low reflectance material, the intensity of reflected light is low. On the other hand, when laser beam 43 is directed to c–d, the intensity of reflected light is high, since laser beam 43 is reflected from second interconnection layer 11 which is made of a high reflectance material. From the resulting data shown in FIG. 12, the laser trimmer recognizes an intermediate point M of the portion c–d in which reflected light intensity is high as the central point e of an alignment mark which has been provided in advance on the chip. Although M and e are not located on the same line in the graph for convenience, they correspond with each other.

In a conventional semiconductor device having an alignment mark, the central point e of the alignment mark is obtained based on the difference in reflected light intensity between any two portions between a–c, d–b and c–d, as described above. The difference in reflected light intensity depends on the difference in reflectance between two materials (i.e. first and second interconnection layers 12 and 11). Therefore, the following problems arise, if an interconnection, made of material of which reflectance is close to that of the material which forms the alignment mark, is provided under the alignment mark.

That is, if the difference in reflectance between two materials is not sufficient, or if the surface of the mark is contaminated, reflected light intensity becomes unstable as shown by curve F in FIG. 13. In such a case, the central point of the region with high intensity of the reflected light, which is recognized as the center of the alignment mark by the laser trimmer might be largely deviated from the actual central point of the alignment mark.

In addition, since the above-described two materials (i.e. first and second interconnections) must be those which form a main body of a semiconductor device, those materials cannot be selected arbitrarily.

Moreover, when an alignment mark is formed on an interconnection as in the above-described conventional example, since the shape of the interconnection is changed into that of the alignment mark, a portion of the interconnection becomes thin, and electric resistance increases at the portion, resulting in degradation of property of a semiconductor device.

SUMMARY OF THE INVENTION

Accordingly, it is an object of the present invention to prevent degradation of property of a semiconductor device having alignment mark formed thereon.

It is another object of the present invention to provide a semiconductor device having an alignment mark which can be recognized accurately.

It is further object of the present invention to provide a semiconductor device having an alignment mark, in which electric resistance does not increase.

A semiconductor device in accordance with the present invention relates to one having an alignment mark which is detected by laser beam. The semiconductor device includes a semiconductor substrate. A first interconnection layer is provided on the semiconductor substrate. An interlayer insulating film is provided on the semiconductor substrate so as to cover the first interconnection layer. A second interconnection layer is provided on the interlayer insulating film so that the first and second interconnection layers cross each other with the interlayer insulating film therebetween. A surface of the second interconnection layer includes as alignment mark a flat portion which reflects the laser beam vertically and upwardly and a portion including concaves and convexes which reflects the laser beam irregularly.

According to the semiconductor device having an alignment mark of the present invention, the difference in reflected light intensity is large, since the alignment mark includes, at a surface of the second interconnection layer, the flat portion which reflects the laser beam vertically and upwardly and the portion including concaves and convexes which reflects the laser beam irregularly.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described with reference to the drawings.

EMBODIMENT 1

Figure 1:
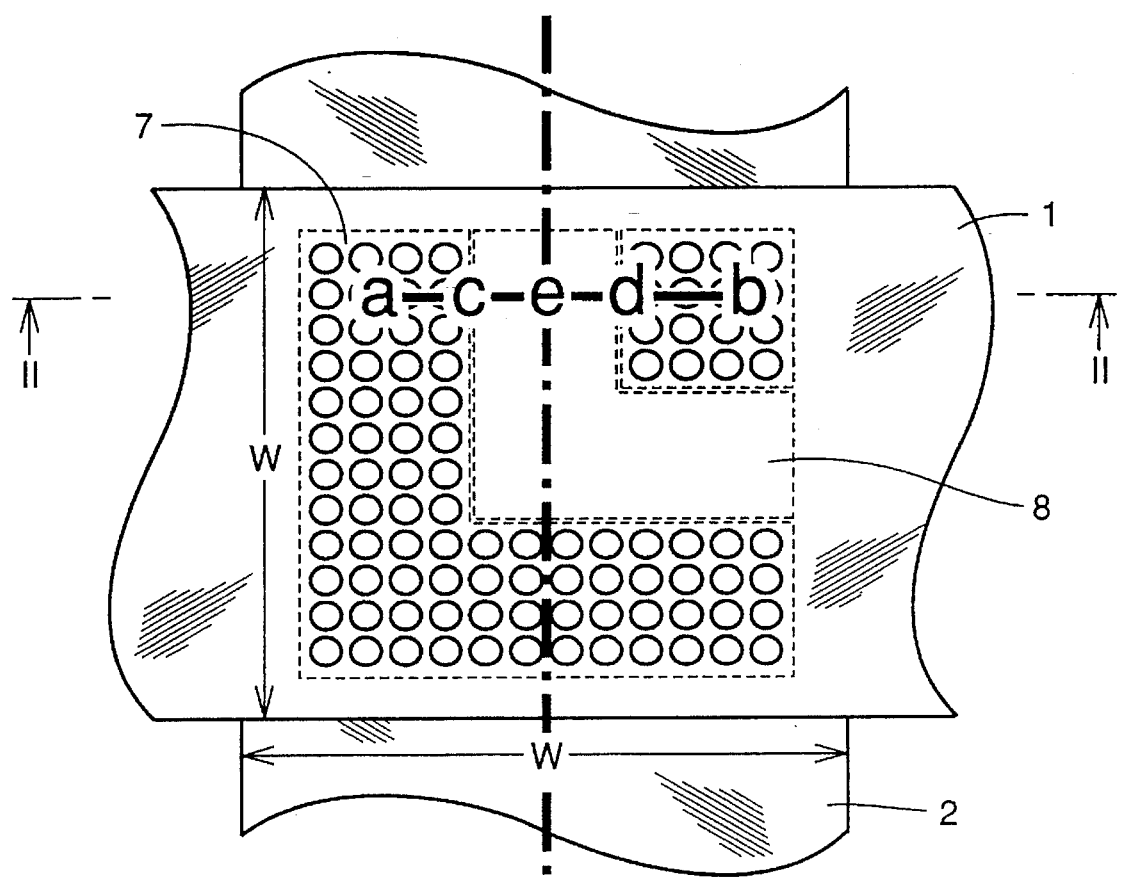
FIG. 1 is a plan view showing an alignment mark portion of a semiconductor device having an alignment mark in accordance with a first embodiment of the present invention.
Figure 2:
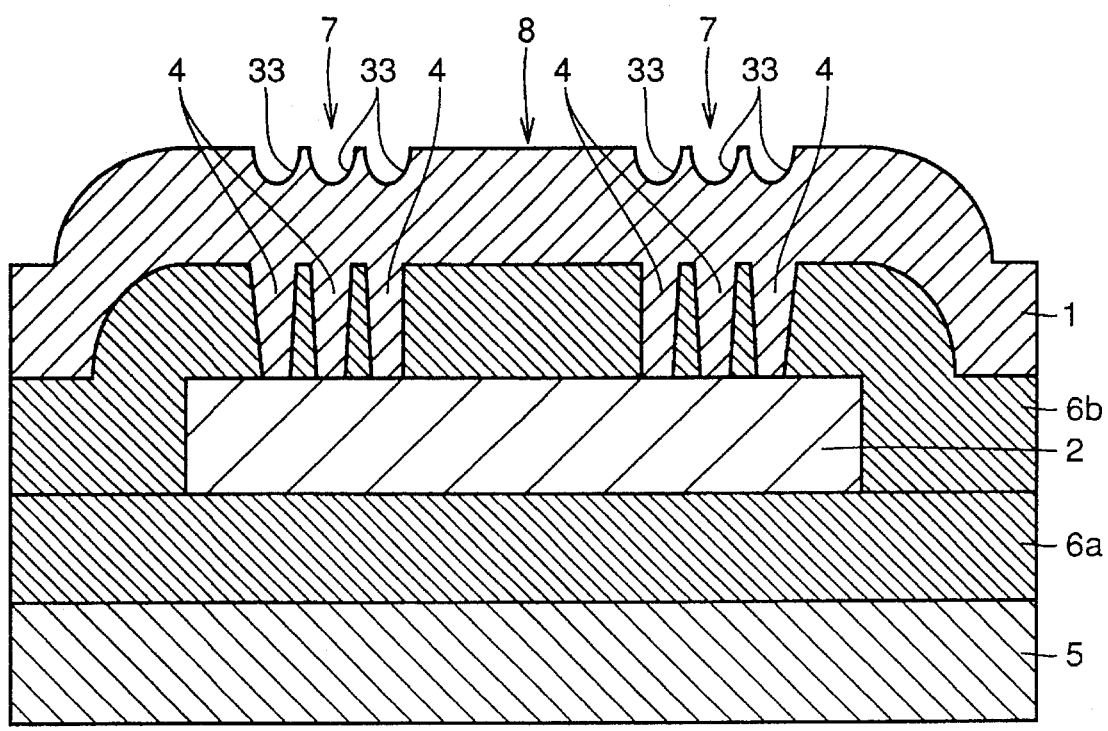
FIG. 2 is a cross section taken along line II—II of FIG. 1.

FIG. 1 is a plan view showing a portion where an alignment mark exists in a semiconductor device having an alignment mark in accordance with a first embodiment of the present invention. FIG. 2 is a cross section taken along line II—II of FIG. 1. Referring to FIGS. 1 and 2, the semiconductor device having an alignment mark in accordance with the first embodiment includes a semiconductor substrate 5. A first interlayer insulating film 6a is provided on semiconductor substrate 5. A first interconnection layer 2 with a width W in the range of 50 to 100 μm is provided on first interlayer insulating film 6a. A second interlayer insulating film 6b is provided on first interlayer insulating film 6a so as to cover first interconnection layer 2. A second interconnection layer 1 with a width W in the range of 50 to 100 μm is provided on second interlayer insulating film 6b, so that first and second interconnection layers 2 and 1 cross each other with second interlayer insulating film 6b therebetween. Second interconnection layer 1 is formed of a high reflectance material, for example, an Al interconnection. A surface of second interconnection layer 1 includes, in a region where first and second interconnection layers 2 and cross each other, a flat portion 8 which reflects laser beam vertically and upwardly and portion 7 including concaves and convexes, i.e., a plurality of recesses which reflects laser beam irregularly, which together form an alignment mark.

Portion 7 including concaves and convexes is formed in such a manner as will now be described.

Referring to FIG. 2, second interlayer insulating film 6b is provided with a plurality of openings 4 for exposing a portion of a surface of first interconnection layer 2, in a region where first and second interconnection layers 2 and 1 cross each other. Second interconnection layer 1 is filled in openings 4 so that it is electrically connected to first interconnection layer 2. Consequently, at a surface of second interconnection layer 1, a plurality of recesses 33 are formed at the locations above openings 4. Portion 7 including concaves and convexes is formed of the plurality of recesses 33 provided on the surface of second interconnection layer 1. At least one side of portion 7 including concaves and convexes is in parallel with one side of the chip. Horizontal diameter of opening 4 must be made smaller than diameter (4 μm) of laser beam which is used for detecting an alignment mark, since laser beam 43 will not be reflected irregularly so long as the diameter of the laser beam is smaller than the horizontal diameter of recess 33. Diameter of opening 4 is preferably in the range of 1 to 2 μm. In addition, width of flat portion 8 must be made larger than the diameter of the laser beam. Other reflective materials, a recess or a stepped portion which causes irregular reflection, or the like except an alignment mark must be eliminated from that region which laser beam scans.

Since detection of an alignment mark and cut off of an interconnection are generally carried out with the same beam diameter, the beam diameter and width of cut off portion will be approximately the same.

Operation will now be described.

Figure 3:
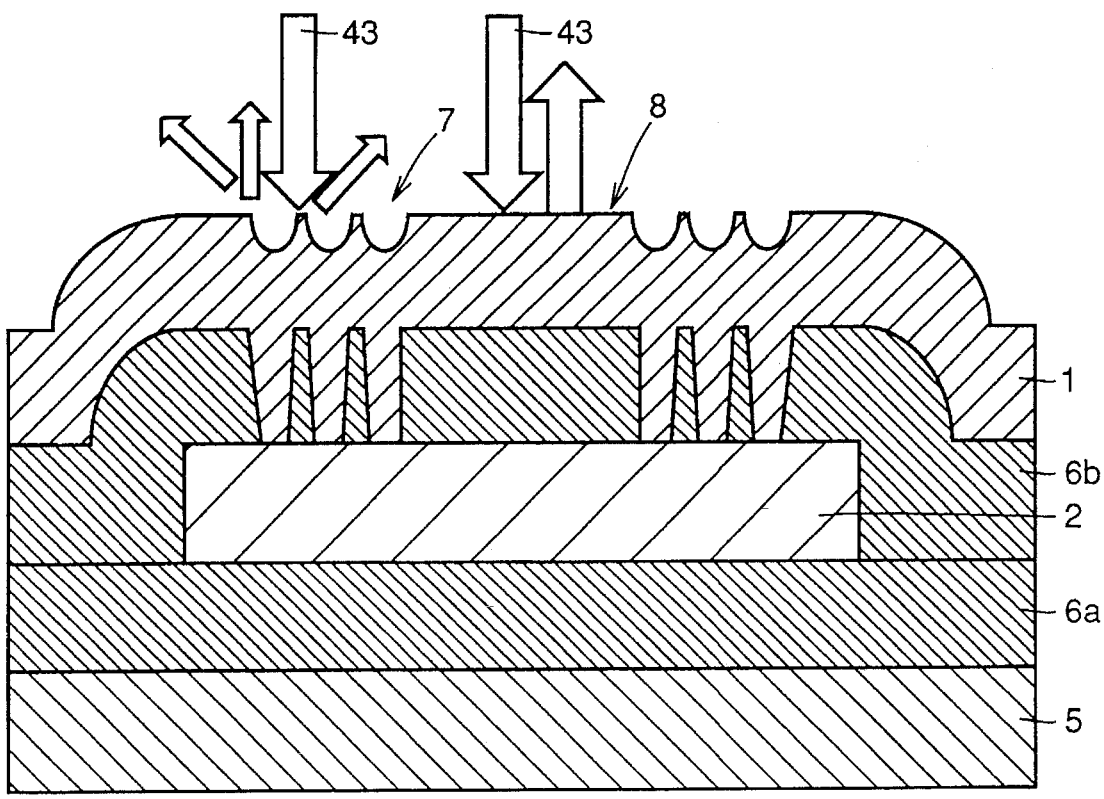
FIG. 3 is a cross section illustrating an operation of the alignment mark in accordance with the first embodiment of the present invention.
Figure 4:
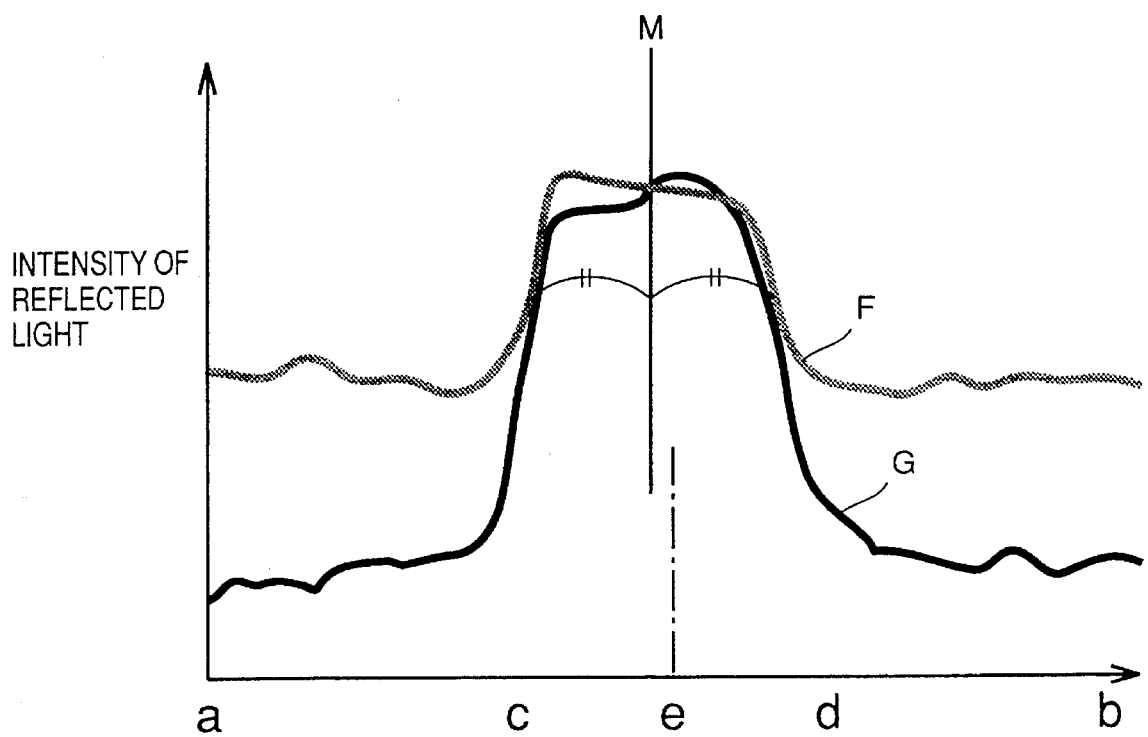
FIG. 4 is a graph showing reflected light intensity of each point between a–b in FIG. 1, when an alignment mark in accordance with the first embodiment is used.

A laser trimmer directs laser beam to a region a–b of FIG. 1, and measures reflected light intensity of each point between a–b at both portion 7 including concaves and convexes and flat portion 8. FIG. 3 shows reflection and irregular reflection of laser beam 43. FIG. 4 is a graph showing reflected light intensity of each point between a–b. Referring to these figures, in flat portion 8, light beam is reflected by second interconnection layer 1, resulting in reflected light with high intensity, while in portion 7 including concaves and convexes, most laser beams are irregularly reflected because of an uneven surface thereof, resulting only in reflected light with low intensity.

In addition, since a conventional alignment mark makes use of the difference in reflectance between two different materials, accurate recognition of an alignment mark cannot be carried out when the difference in reflectance between these two materials is not sufficient. However, since an alignment mark in accordance with the first embodiment of the present invention is formed of only one material, recognition of an alignment mark is not affected by the difference in reflectance between materials.

Moreover, since difference in reflected light intensity in an alignment mark in accordance with the first embodiment can be made larger (see curve G in FIG. 4) compared to that in the conventional alignment mark (see curve F in FIG. 4), accurate recognition of an alignment mark can always be achieved.

Since width of second interconnection layer 1 does not become small, electric resistance will not increase.

EMBODIMENT 2

Figure 5:
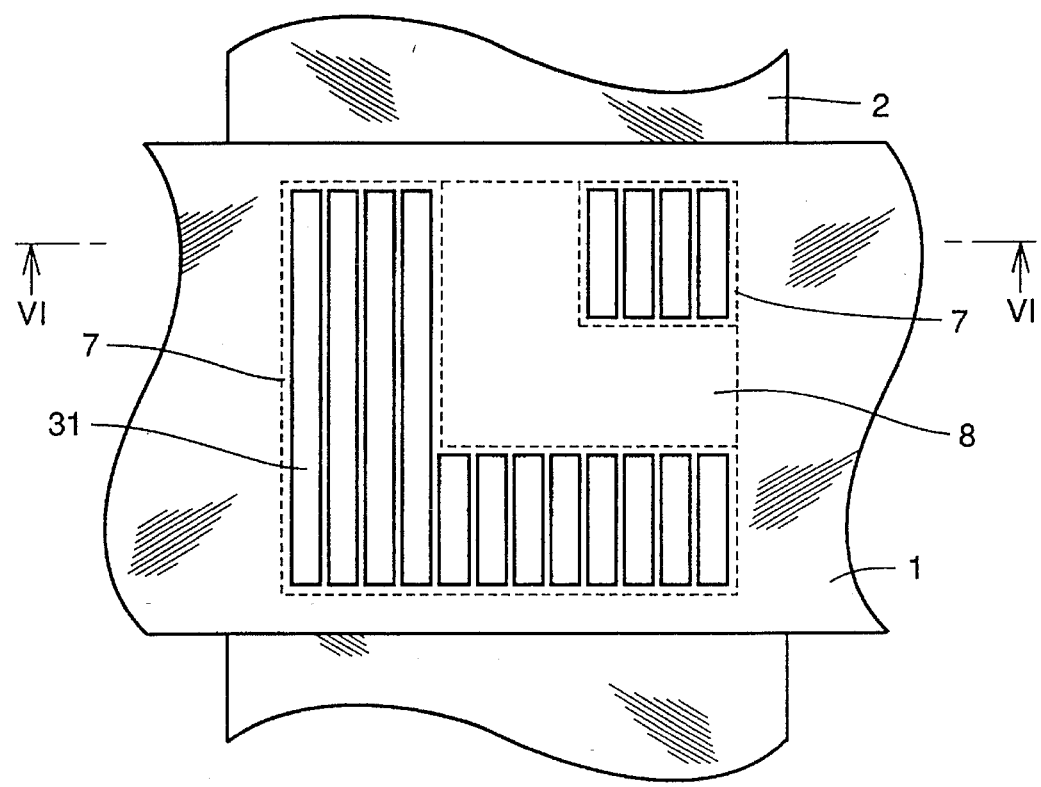
FIG. 5 is a plan view showing of an alignment mark portion of a semiconductor device having an alignment mark in accordance with a second embodiment of the present invention.
Figure 6:
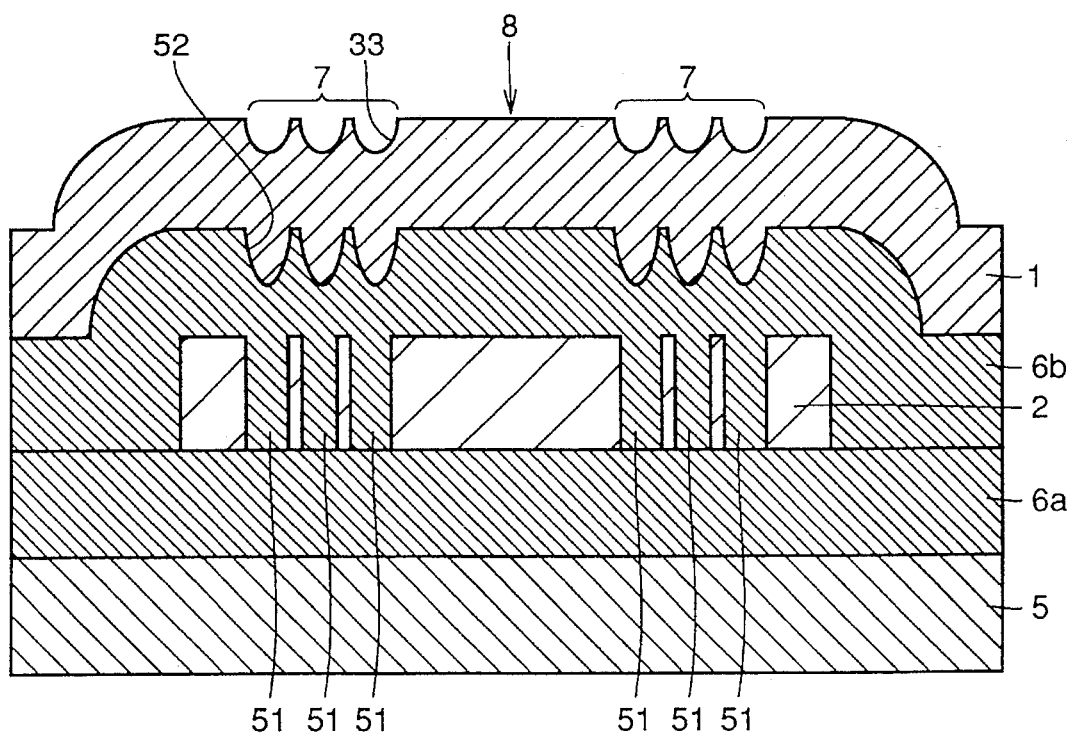
FIG. 6 is a cross section taken along line VI—VI of FIG. 5.
Figure 7:
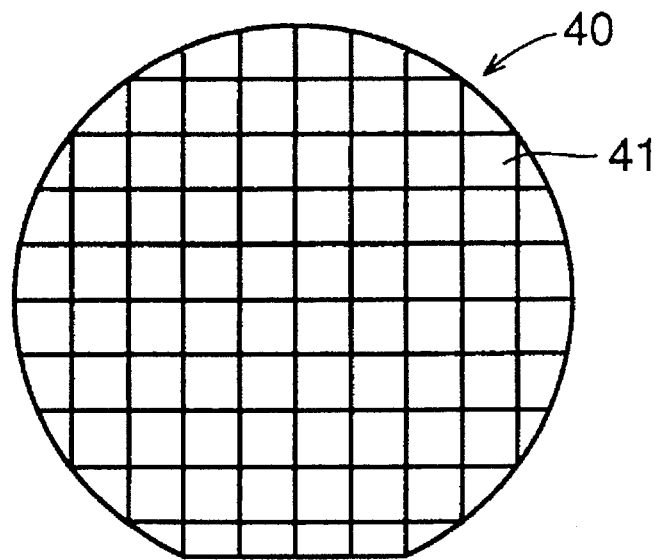
FIG. 7 is a plan view showing a conventional wafer.
Figure 8:
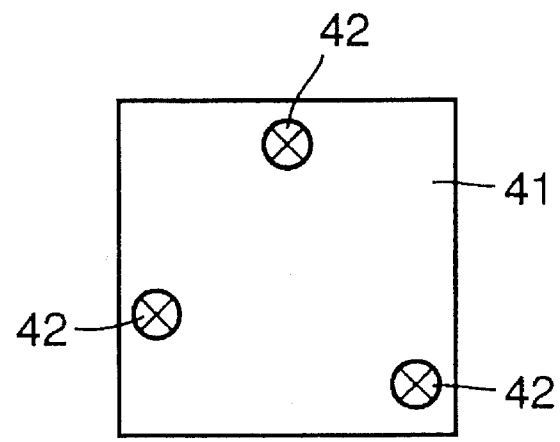
FIG. 8 is a plan view showing a conventional chip.
Figure 9:
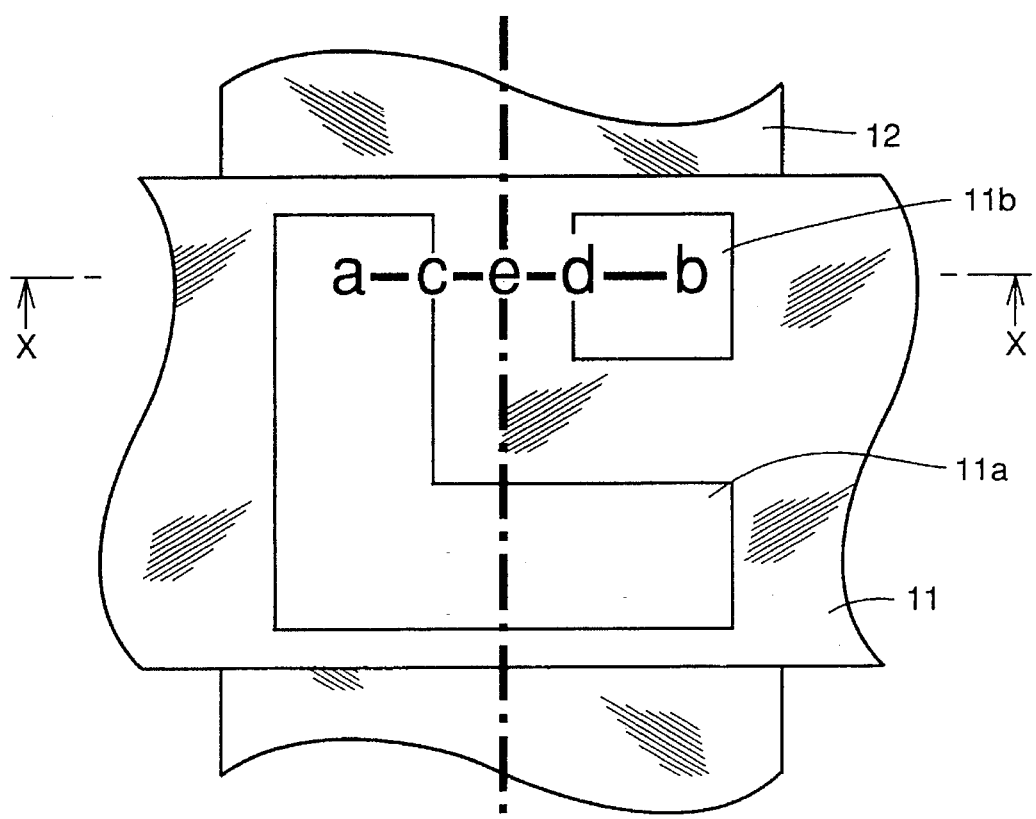
FIG. 9 is a plan view showing an alignment mark portion of a conventional semiconductor device having an alignment mark.
Figure 10:
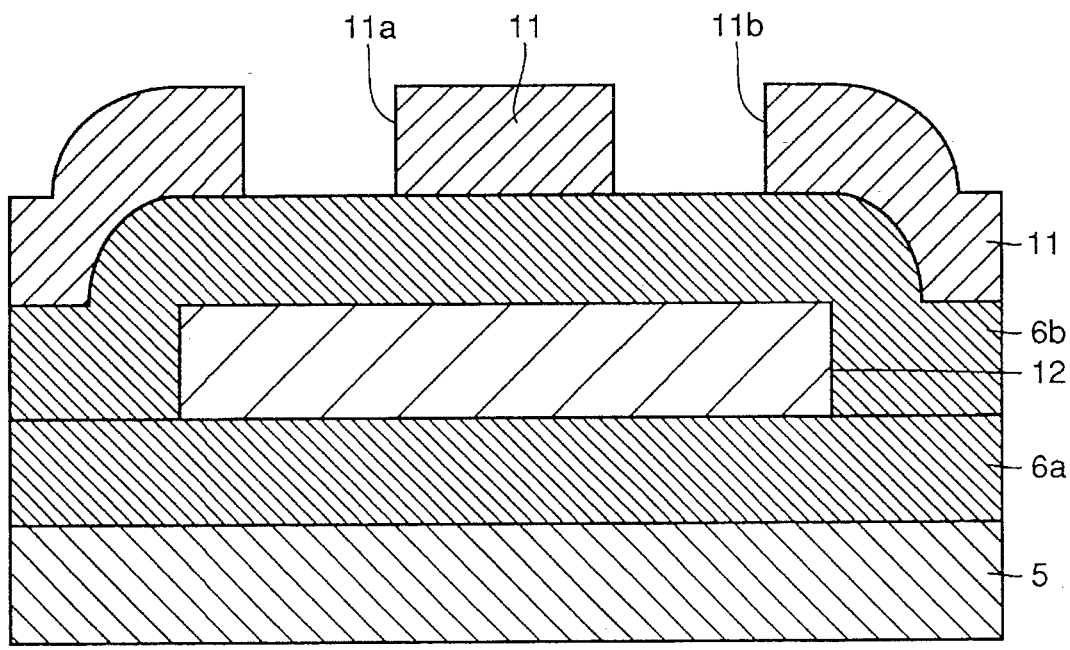
FIG. 10 is a cross section taken along line X—X of FIG. 9.
Figure 11:
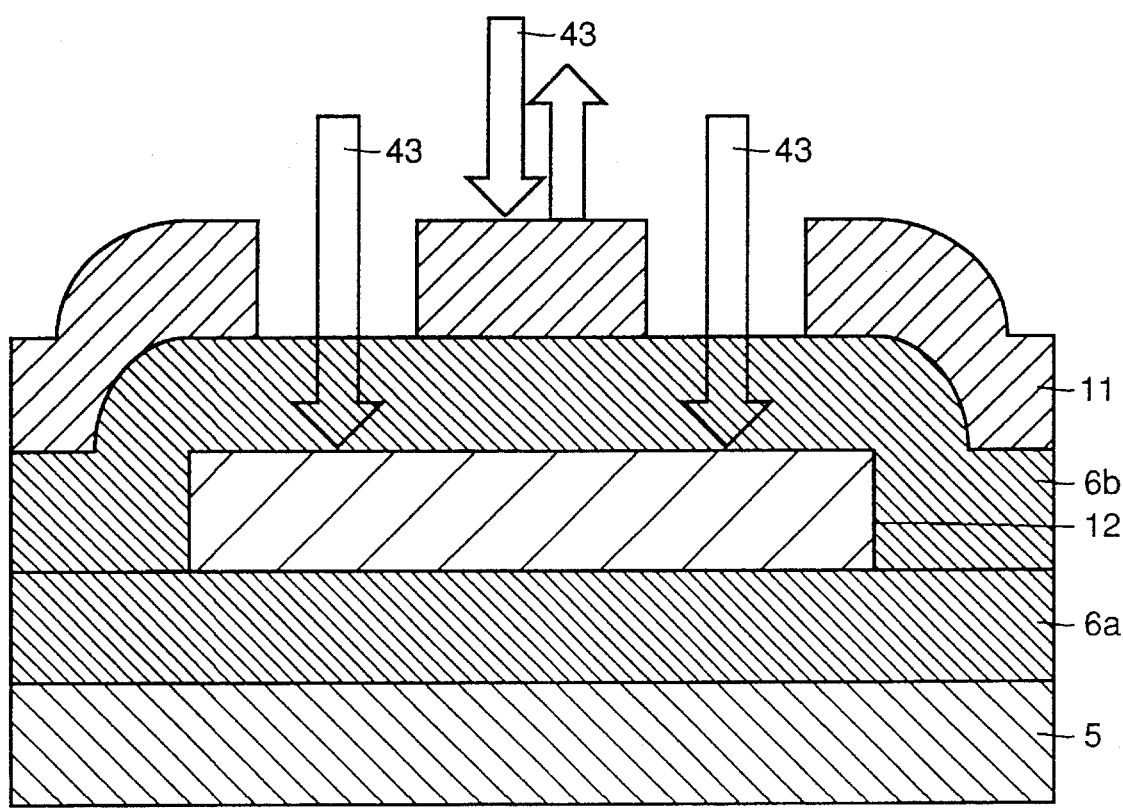
FIG. 11 is a cross section showing how a laser beam is reflected when the conventional alignment mark is used.
Figure 12:
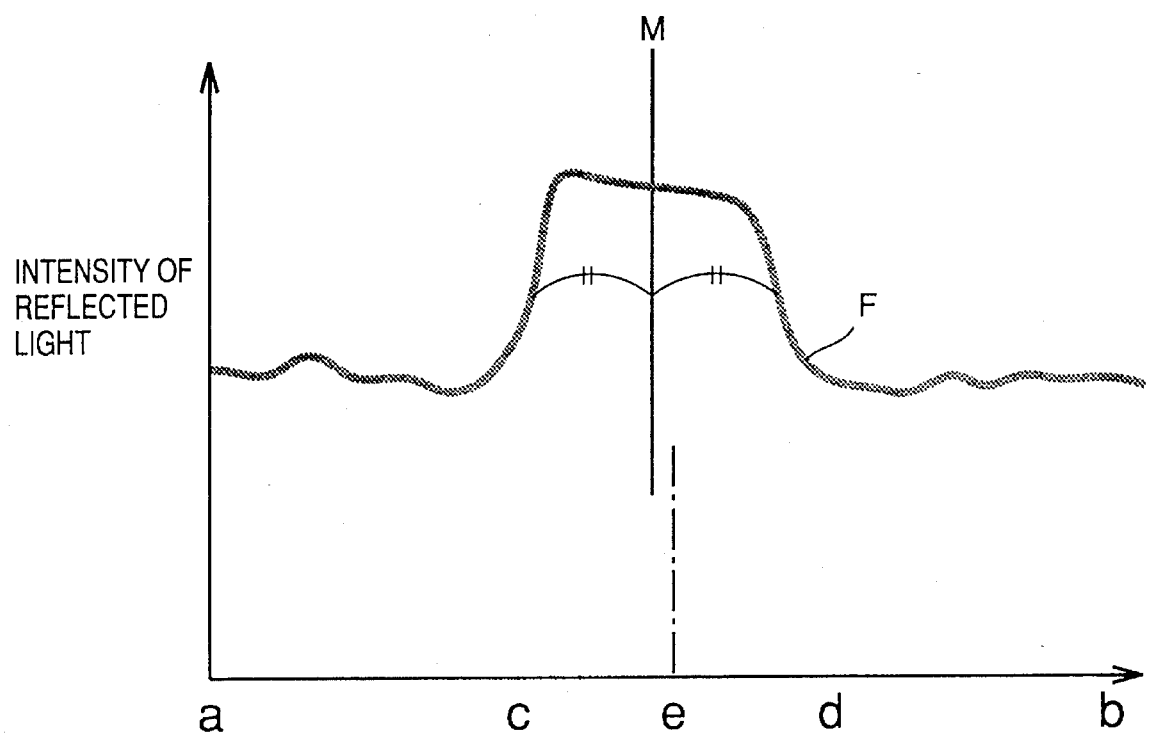
FIG. 12 is a graph showing reflected light intensity of each point between a–b in FIG. 9, when the conventional alignment mark is used.
Figure 13:
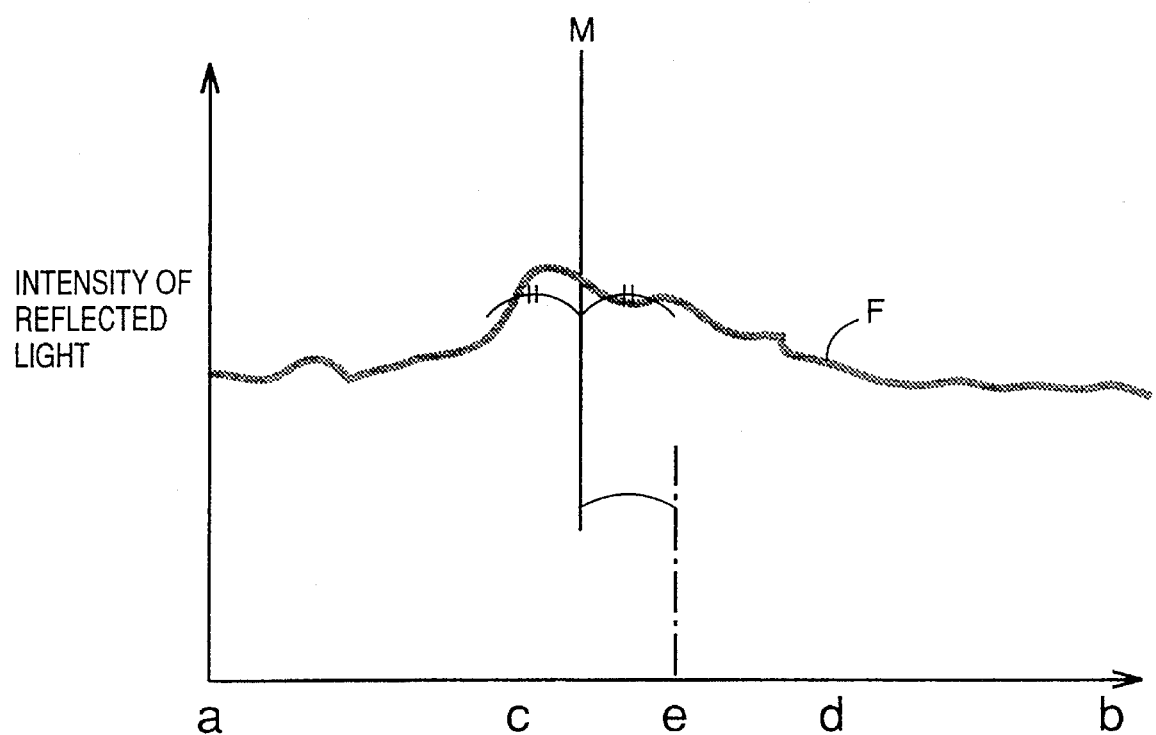
FIG. 13 is a graph showing a problem which arises when the conventional alignment mark is used.

FIG. 5 is a plan view showing an alignment mark portion of a semiconductor device having an alignment mark in accordance with a second embodiment of the present invention. FIG. 6 is a cross section taken along line VI—VI in FIG. 5.

Since an alignment mark in accordance with the second embodiment of the present invention is the same as that in accordance with the first embodiment except for the following respects, the same or corresponding portions are represented by the same reference numerals, and description thereof will not be repeated.

In the second embodiment, a first interconnection layer 2 includes, in a region where first and second interconnection layers 2 and 1 cross each other, a plurality of openings 51 for exposing a portion of a surface of a first interlayer insulating film 6a. A second interlayer insulating film 6b is filled in openings 51 which are provided in first interconnection layer 2. Consequently, at a surface of second interlayer insulating film 6b, recesses 52 are formed at the locations which correspond to openings 51. A second interconnection layer 1 is provided on second interlayer insulating film 6b so that it is filled in recesses 52 at the surface of second interlayer insulating film 6b. At a surface of second interconnection layer 1, recesses 33 are formed at the locations which correspond to recesses 52 which have been at the surface of second interlayer insulating film 6b. Thus, a flat portion 8 which reflects laser beam vertically and upwardly, and a portion 7 including concaves and convexes which reflects laser beam irregularly are formed at the surface of the second interconnection layer.

EMBODIMENT 3

Although portion 7 including concaves and convexes, i.e. a portion of irregular reflection, is shown by way of example provided on both sides of flat portion 8 so that flat portion 8 is sandwiched therebetween in the first and second embodiments, the present invention is not limited to this, and the same effects as in the first and second embodiments can be obtained, even if flat portion 8 is provided on both sides of portion 7 including concaves and convexes so that portion 7 including concaves and convexes is sandwiched therebetween.

As described above, in the semiconductor device having an alignment mark in accordance with the present invention, since an alignment mark includes a flat portion which reflects laser beam vertically and upwardly and a portion including concaves and convexes which reflects laser beam irregularly, both of which are formed at a surface of a second interconnection layer, difference in reflected light intensity becomes large, resulting in accurate recognition of the alignment mark.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having an alignment mark which is detected by laser beam, comprising:

a semiconductor substrate;

a first interconnection layer provided on said semiconductor substrate;

an interlayer insulating film provided on said semiconductor substrate so as to cover said first interconnection layer; and a second interconnection layer provided on said interlayer insulating film so that said first and second interconnection layers cross each other with said interlayer insulating film therebetween, wherein a surface of said second interconnection layer is provided, in a particular region where said first and second interconnection layers cross each other, with a flat portion which reflects said laser beam vertically and upwardly and a portion including a plurality of recesses which reflect said laser beam irregularly, which together form said alignment mark within the particular overlapping portion.

2. The semiconductor device having an alignment mark according to claim 1, wherein said portion including a plurality of recesses is provided on both sides of said flat portion so that said flat portion is sandwiched therebetween.

3. The semiconductor device having alignment mark according to claim 1, wherein said flat portion is provided on both sides of said portion including a plurality of recesses so that said portion including a plurality of recesses is sandwiched therebetween.

4. The semiconductor device having an alignment mark according to claim 1, wherein said interlayer insulating film is provided, in a region where said first and second interconnections cross each other, with a plurality of openings for exposing a portion of a surface of said first interconnection layer; and a portion of said second interconnection layer is filled in said openings so as to be electrically connected to said fist interconnection layer.

5. The semiconductor device having an alignment mark according to claim 1, wherein horizontal diameter of said recess is made smaller than diameter of said laser beam.

6. The semiconductor device having an alignment mark according to claim 1, wherein said first interconnection layer is provided with a plurality of recesses in a region where said first and second interconnection layers cross each other;

said interlayer insulating film is provided so as to be filled in said recesses; and said second interconnection layer is formed so as to be filled in recesses at a surface of said interlayer insulating film.

\* \* \* \* \*